United States Patent

Havemann et al.

[11] Patent Number: 5,891,804
[45] Date of Patent: Apr. 6, 1999

[54] PROCESS FOR CONDUCTORS WITH SELECTIVE DEPOSITION

[75] Inventors: Robert H. Havemann, Garland; Richard A. Stoltz, Plano, both of Tex.

[73] Assignee: Texas Instruments Incorporated, Dallas, Tex.

[21] Appl. No.: 839,783

[22] Filed: Apr. 14, 1997

Related U.S. Application Data

[60] Provisional application No. 60/015,843, Apr. 18, 1996.

[51] Int. Cl.⁶ .................................................. H01L 21/44
[52] U.S. Cl. ........................ 438/674; 438/675; 438/678; 438/641; 438/687; 438/685
[58] Field of Search .................................... 438/672–675, 438/678, 629–630, 637–639, 687, 641–643, 685

[56] References Cited

U.S. PATENT DOCUMENTS

| | | |
|---|---|---|
| 5,116,463 | 5/1992 | Lin et al. . |
| 5,198,389 | 3/1993 | Van Der Putten et al. ............. 438/675 |
| 5,290,733 | 3/1994 | Hayasaka et al. ...................... 438/678 |
| 5,312,773 | 5/1994 | Nagashima . |
| 5,354,712 | 10/1994 | Ho et al. . |
| 5,391,517 | 2/1995 | Gelatos et al. . |
| 5,429,989 | 7/1995 | Fiordalice et al. ...................... 438/672 |
| 5,654,245 | 8/1997 | Allen . |

*Primary Examiner*—Jey Tsai
*Attorney, Agent, or Firm*—Lawrence J. Bassuk; Christopher L. Maginniss; Richard L. Donaldson

[57] ABSTRACT

This is a method of forming a conductor 26 on an interlevel dielectric layer 12 which is over an electronic microcircuit substrate 10, and the structure produced thereby. The method utilizes: forming an intralevel dielectric layer 14 over the interlevel dielectric layer 12; forming a conductor groove in the intralevel dielectric layer 14 exposing a portion of the interlevel dielectric layer 12; anisotropically depositing a selective deposition initiator 24 onto the intralevel dielectric layer 14 and onto the exposed portion of the interlevel dielectric layer 14; and selectively depositing conductor metal 26 to fill the groove to at least half-full. The selective deposition initiator 24 may selected from the group consisting of tungsten, titanium, paladium, platinum, copper, aluminum, and combinations thereof. In one embodiment, the selective deposition initiator 24 is paladium, and the selectively deposited conductor metal 26 is principally copper.

16 Claims, 11 Drawing Sheets

PROCESS FOR CONDUCTORS WITH SELECTIVE DEPOSITION

CROSS REFERENCE TO RELATED APPLICATIONS

A method providing metallization above a semiconductor substrate is described in related application U.S. Pat. Ser. No. 60/015,843, filed Apr. 18, 1996 and assigned to the same assignee.

FIELD OF THE INVENTION

This invention relates to microcircuits and in particular to methods of providing metalization above a semiconductor substrate.

BACKGROUND OF THE INVENTION

In the semiconductor industry the fabrication of microelectronic circuits typically uses single-crystal silicon and typically requires that several thin films of both insulating and conducting materials be formed and patterned sequentially on the silicon surface. The conventional wiring above a semiconductor substrate utilizes aluminum conductors with a small amount of copper, however, some microcircuits have been proposed using copper conductors. Copper wiring and electroless copper eposition are, of course, known for printed circuit boards.

Generally, the insulating films are a dense silicon dioxide dielectric, both horizontally between the conductors (intralevel dielectric) and vertically between layers of conductors (interlevel dielectric). Metal filled vias are used, e.g., to provide electrical connections between conductors in different levels. Such metal filling has generally been provided by physical vapor deposition (PVD), e.g. sputtering or vacuum deposition.

SUMMARY OF THE INVENTION

This invention utilizes conductor grooves at least partially filled with selective aluminum, tungsten and/or copper. By using selective deposition, initiated at the bottom of the groove, void problems incurred in the PVD filling of high aspect ratio vias (height to width ratios of greater than 1) are generally avoided.

This is a method of forming a conductor on an interlevel dielectric layer which is over an electronic microcircuit substrate, and the structure produced thereby. The method utilizes: forming an intralevel dielectric layer over the interlevel dielectric layer; forming a conductor groove in the intralevel dielectric layer exposing a portion of the interlevel dielectric layer; anisotropically depositing a selective deposition initiator onto the intralevel dielectric layer and onto the exposed portion of the interlevel dielectric layer; and selectively depositing conductor metal to fill the groove to at least half-full Preferably the blanket deposited conductor metal consists essentially of aluminum tungsten, copper and combinations thereof. In one embodiment, the selectively deposited conductor metal is principally copper. Prior to forming the conductor, photoresist is preferably deposited directly or indirectly on the interlevel dielectric, and the photoresist is patterned and utilized as an etch mask for the forming of the groove, and in one embodiment, the photoresist is stripped after the selective deposition of the conductor metal In an alternate embodiment a sacrificial layer is deposited prior to the deposition of the photoresist, and the photoresist is stripped prior to the selective deposition of the conductor metal and the sacrificial layer is stripped after the selective deposition of the conductor metal In one embodiment, the selectively deposited conductor metal fills the groove to less than full, and additional conductor metal is deposited by physical vapor deposition (e.g. by HDP sputtering, e.g. at a temperature of 300–600 degrees C.). A dopant metal may deposited along with the additional conductor metal and the selectively deposited conductor metal may be doped by dopant diffusion from said additional conductor metal. The sputtering may be followed by metal reflow at a temperature of 300–600 degrees C. or extrusion at a pressure of 500–4000 psi The selective deposition initiator may be selected from the group consisting of tungsten, titanium, paladium, platinum, copper, aluminum, and combinations thereof. In one embodiment, the selective deposition initiator is paladium, and the selectively deposited conductor metal is principally copper. In one embodiment, the selectively deposited conductor metal essentially fills the groove to form the conductors, and thereafter, the conductors and the interlevel dielectric are planarized by chemical mechanical polishing.

BRIEF DESCRIPTION OF THE DRAWINGS

This invention can be best understood by reference to the following drawings in which.

DESCRIPTION OF THE REFERRED EMBODIMENTS

This invention provides a method and structure for conductors and/or vias on a microcircuit substrate, and in particular an at least partially selectively deposited process for so doing.

The conductors and vias of this invention will generally be either copper or aluminum or tungsten or combinations thereof. Copper generally presents difficulties in dry etching, and one approach to copper has been to use a damascene type process in which a via or trench has been filled (e.g., by vacuum deposition of the metal or sputtering) which fills the hole and coats the top surface of the surrounding insulators, followed by removal of the material which is on top of the insulators, for example by chemical mechanical polishing (CW). The process in several embodiments is shown with encapsulation as would generally be used with copper, but with aluminum or tungsten, while conductor sidewalls are still preferred, complete encapsulation will typically not be used. Although a dense interlevel dielectric can be used, a low density "aerogel type dielectric is preferred and is used in the examples herein. The deposition of low density aerogel is described in co-pending application U.S. Pat. Ser. No. 08/ 748,926, filed Nov. 14, 1996, now U.S. Pat. No. 5,807,607, entitled "Polyol-based Method for Forming Thin-Film Aerogel on Semiconductor Substrates".

Figure 1A:
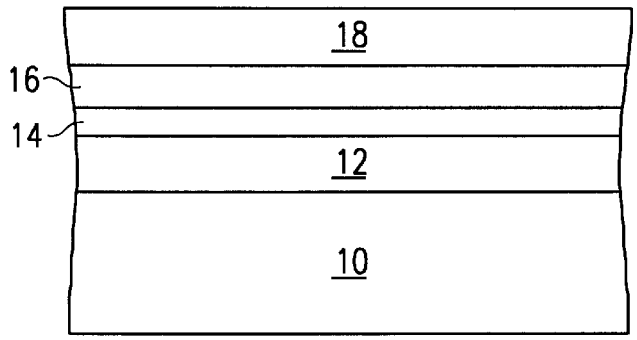
FIGS. 1A–1K show the steps in producing a microcircuit conductors and the product produced thereby, using conductor encapsulation, as might be used, e.g., with copper conductors.
Figure 1B:
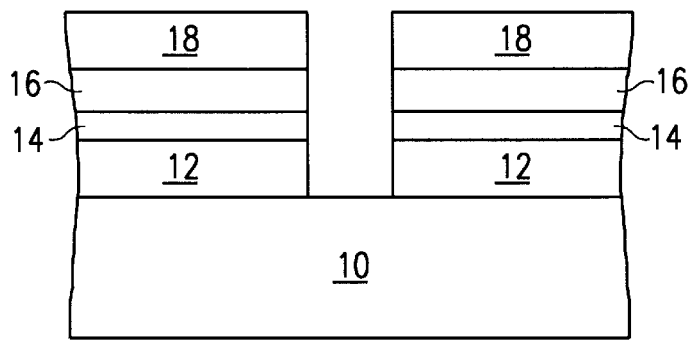
Figure 1C:
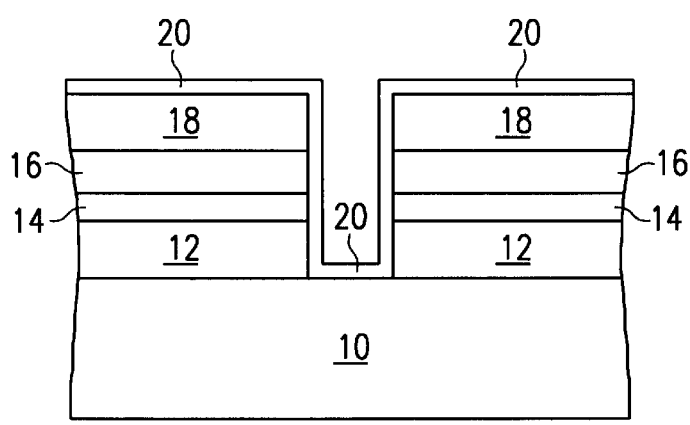
Figure 1D:
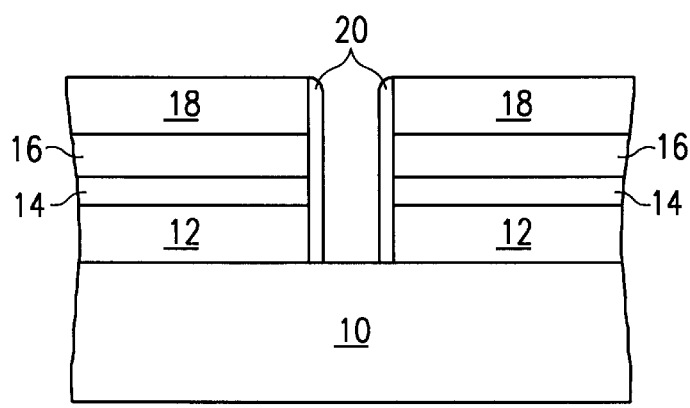
Figure 1E:
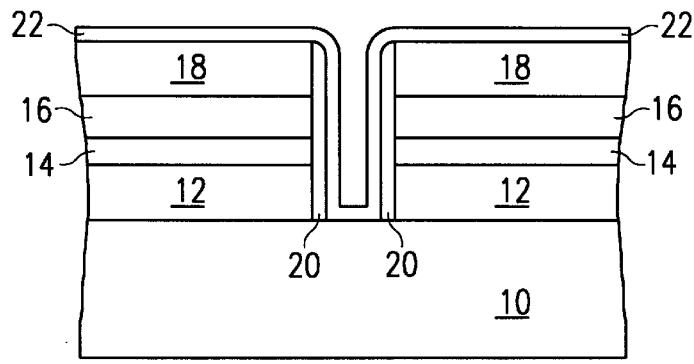

FIG. 1A–1K show a damascene type process for conductors which could be used with copper metalization, (encapsulation is preferred with copper filled vias and copper conductors and a damascene process is preferred for copper conductors). The substrate 10 generally contains microelectronic components, and may, as used herein, contain conductors and dielectrics over a silicon substrate. A low density aerogel 12 (e.g., one micron thick layer of 30% theoretical density aerogel) is used as the interlevel dielectric. The aerogel is then aged (e.g., for one minute at 140° C.). This embodiment uses high density layer of aerogel 14 e.g., 0.1 micron at 85–90% density) is then applied over the low density aerogel and aged, and both aerogel layers are dried. A physical vapor deposition sacrificial layer 16 (e.g., 0.05 microns of silicon nitride) is applied over the aerogel and a photoresist 18 is applied over the sacrificial layer to give the structure of FIG. 1A FIG. 1B shows the structure after the photoresist has been patterned and the underlying layers etched down to the substrate 10. FIG. 1C shows the structure after a dielectric seal layer (e.g., 0.01 micron of parylene) has been deposited. FIG. 1D shows the structure after an isotropic etch back has removed the dielectric seal layer material from the horizontal surfaces to provide a sidewall type dielectric seal 20. FIG. 1E shows the chemical vapor deposited titanium nitride encapsulation layer 22, which is deposited to a thickness of, for example, 0.01 micron.

Figure 1F:
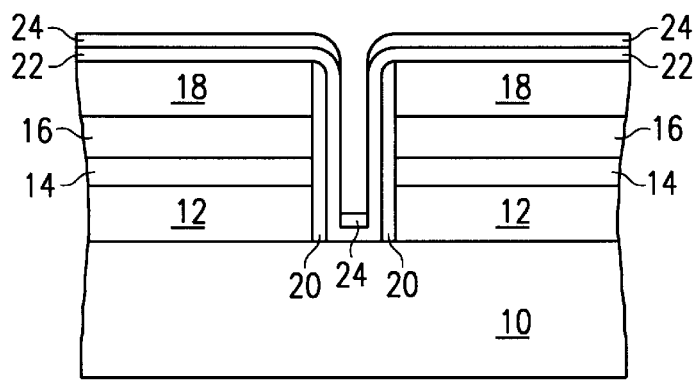
Figure 1G:
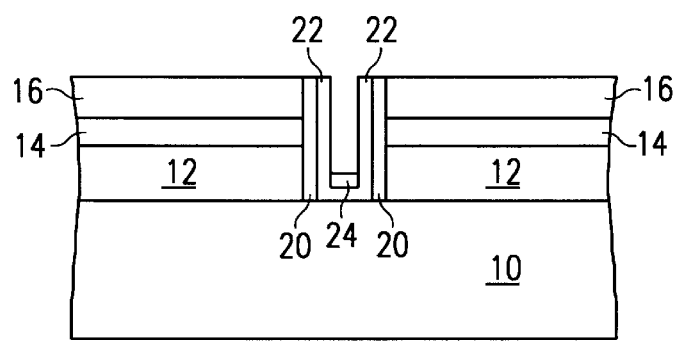
Figure 1H:
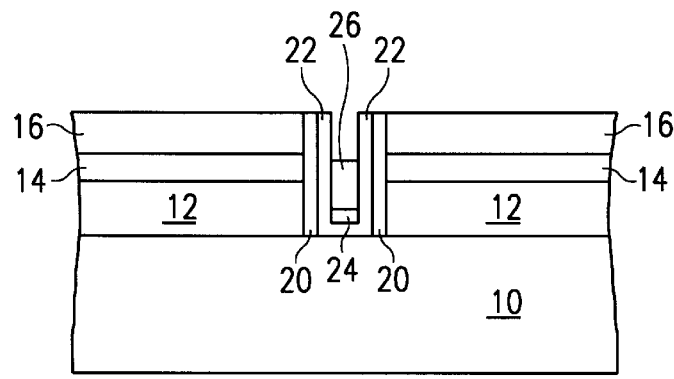

FIG. 1F shows an isotropically deposited selective deposition initiator 24 (e.g., vacuum deposited or sputtered palladium or platinum). The photoresist layer 18 is then stripped to reject all layers above it, leaving the structure as shown in FIG. 1G. The conductor material 26 is then selectively deposited on the initiator 24 (e.g., copper by the "electrolysis" copper deposition process from liquid precursor as known in the art (to partially fill the groove, preferably to above the bottom of the high density aerogel layer 14, but below the bottom of the sacrificial layer 16 to produce the structure of FIG. 1H. It will be noted that, under some conditions, the selective deposition will also occur, but at a much lower rate, on the titanium nitride encapsulation. Silicon nitride could be used as the encapsulating material to give even greater selectivity, but would need to be selectively removed (e.g. from any bottom portion where the conductor is to make electrical contact to via metal).

Figure 1I:
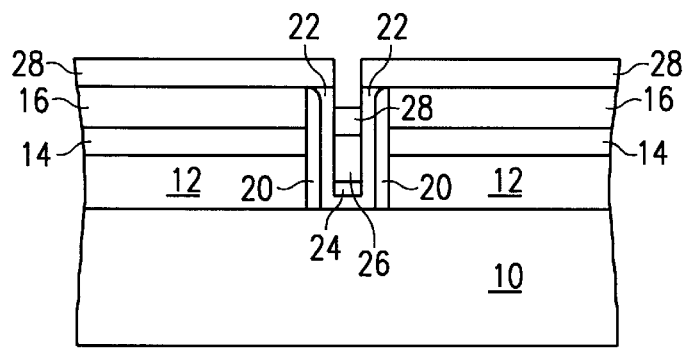
Figure 1J:
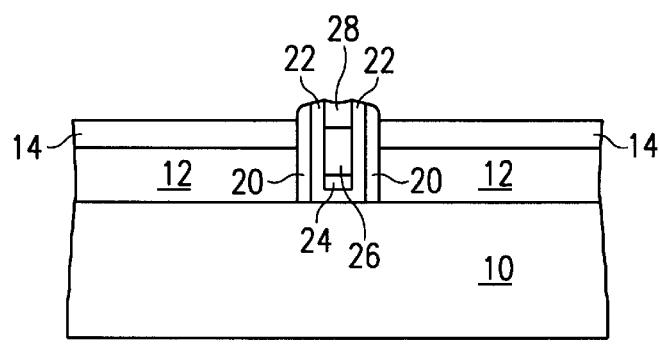
Figure 1K:
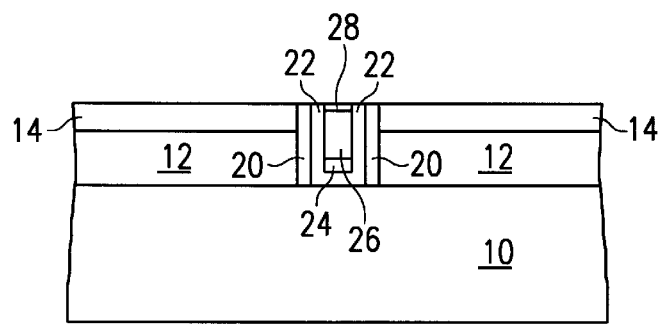

FIG. 1I shows top conductor encapsulation 28 (e.g., physical vapor deposited titanium nitride with a thickness of about 0.01 micron) deposited on horizontal surfaces and covering the top of conductor 26 to above the bottom of sacrificial layer 16. The sacrificial layer 16 is then stripped to reject the portion of the top conductor encapsulation 28 which is above the sacrificial layer 16. This provides the configuration of FIG. 1J. Chemical mechanical polishing (CMP) can then be used to planarize the structure to produce the configuration of FIG. 1K FIGS. 2A through 2E show an encapsulation type process for vias (again as might be used with copper metalization).

Figure 2A:
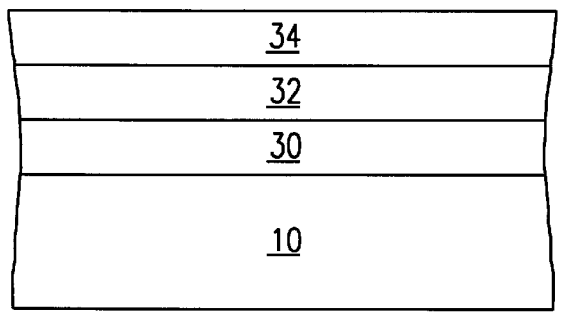
FIGS. 2A–2E show the steps in producing a microcircuit vias and the product produced thereby, using via encapsulation, as might be used, e.g., with copper filled vias.
Figure 2B:
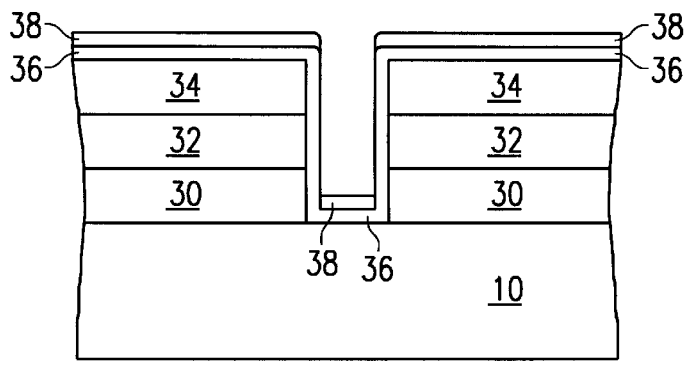
Figure 2C:
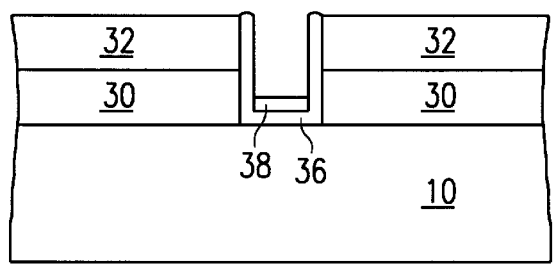
Figure 2D:
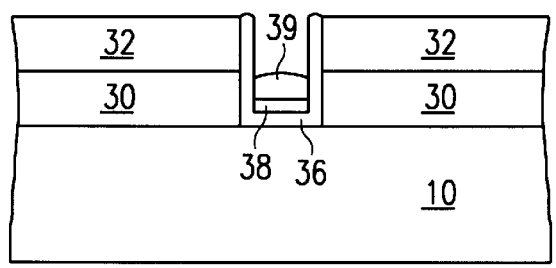
Figure 2E:
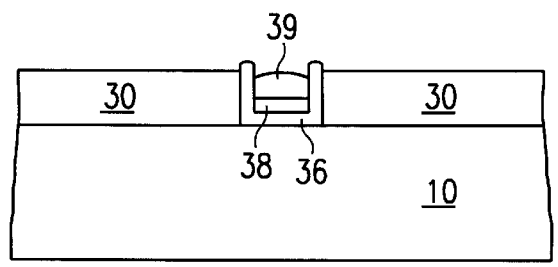

FIG. 2A shows an enter level dielectric layer 30 (e.g., spin on glass or high density aerogel) on top of a substrate 10 (again substrate 10 contains micro electronic circuit components and can contain lower levels of conductors and dielectrics. Sacrificial layer 32 (e.g., silicon nitride) is over the enter level dielectric layer 30, and photoresist layer 34 is over the sacrificial layer 32. FIG. 2B shows the structure after patterning of the photoresist and etching of the sacrificial layer 32 and the enter level 30. A via encapsulation 36 (e.g., chemical vapor deposited titanium nitride) has been deposited, and a via selective deposition initiator 36 has been added by physical vapor deposition (e.g., vacuum deposited palladium or platinum) to produce the configuration of FIG. 2B. Stripping of the photoresist 34 rejects the top portion of the encapsulation material 36 and the via selective deposition initiator 38 to produce the structure of FIG. 2C. Via metal 39 is deposited on the via selective deposition initiator 38 (to produce the structure of 2D). The sacrificial layer is then stripped to produce the structure of FIG. 2E, rejecting the portion of the via selective deposition initiator 38 which was on top of the sacrificial layer 32, and also removing any of the via metal which may have been inadvertently deposited stripping the sacrificial layer 32 removes any via metal 39 which may have been inadvertently deposited in areas other than on top of the via selective deposition initiator 38, and removes portions of the via encapsulation 36 which extended over the top of the intralevel dielectric 30 to produce the configuration of 2E a note that the structure can be planarized by chemical mechanical polishing at this time without touching the via metal 39, and thus problems with via metal 39 being physically moved ("smeared") and deposited on top of the intralevel dielectric 30 is eliminated.

Figure 3A:
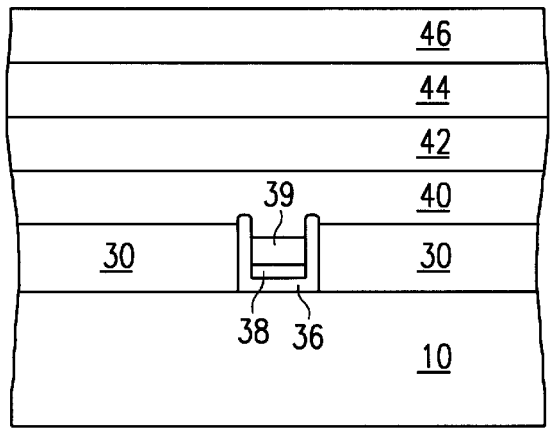
FIGS. 3A–3G show a process for creating a combined via and conductor by a damascene technique and the structure produced thereby, using via and conductor encapsulation, as might be used, e.g., with copper filled vias and conductors.
Figure 3B:
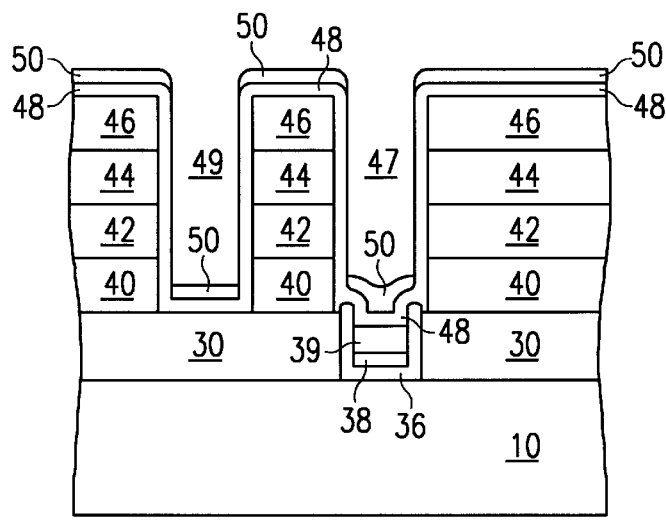
Figure 3C:
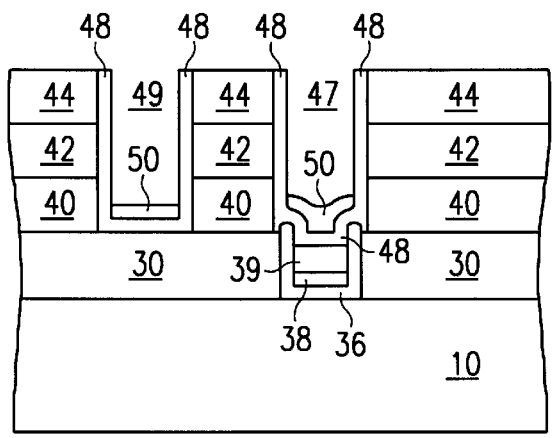
Figure 3D:
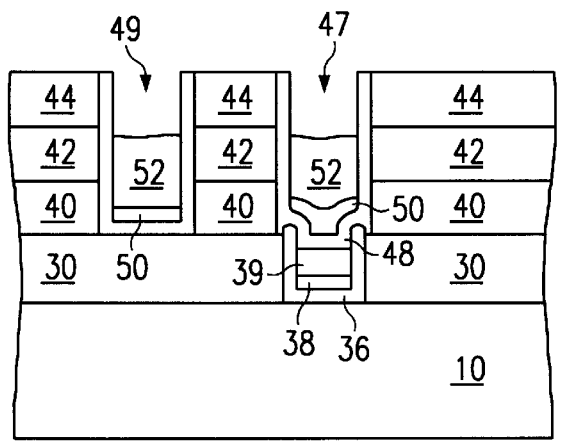
Figure 3E:
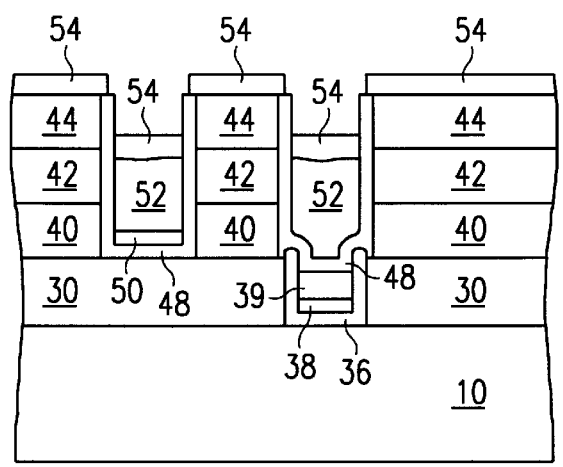
Figure 3F:
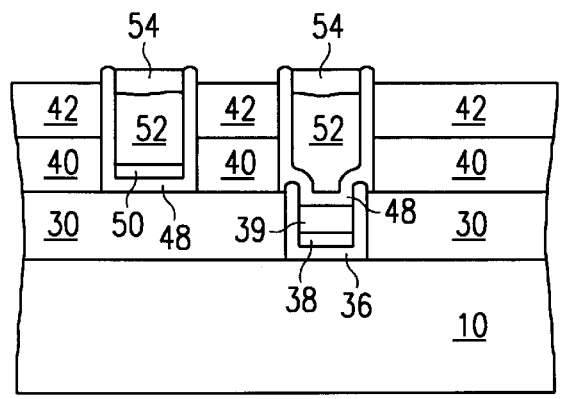
Figure 3G:
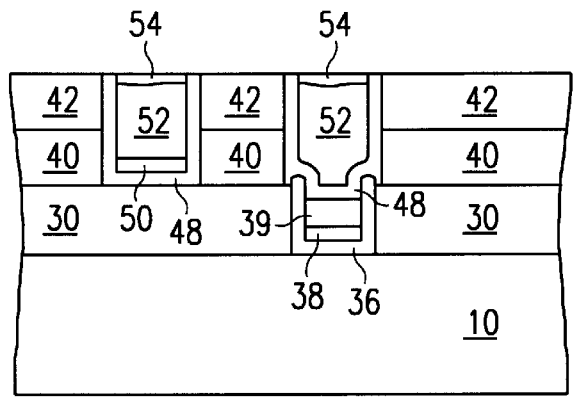
Figure 4A:
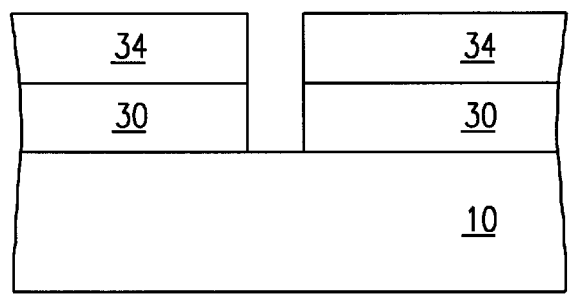
FIGS. 4A–4E show the steps in producing a microcircuit vias and the product produced thereby, without using via encapsulation, as might be used, e.g., with aluminum filled vias.
Figure 4B:
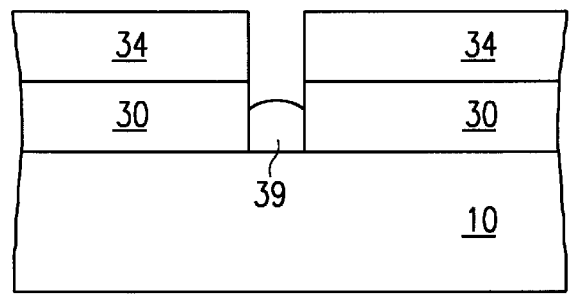
Figure 4C:
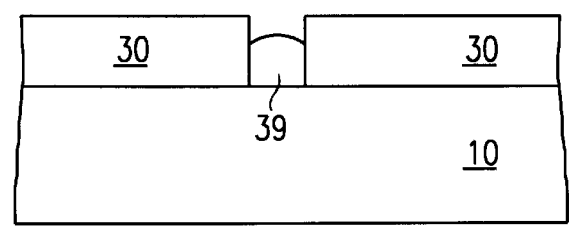
Figure 4D:
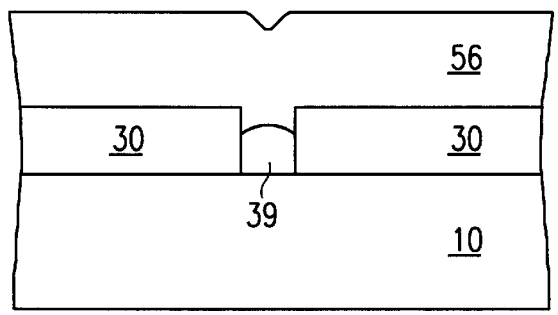
Figure 4E:
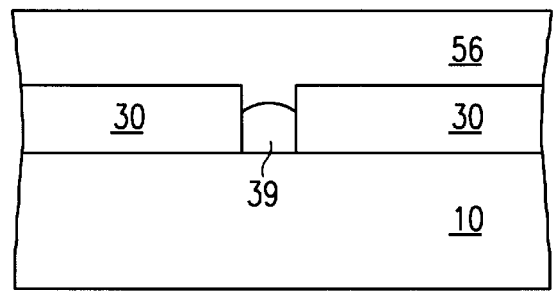
Figure 5A:
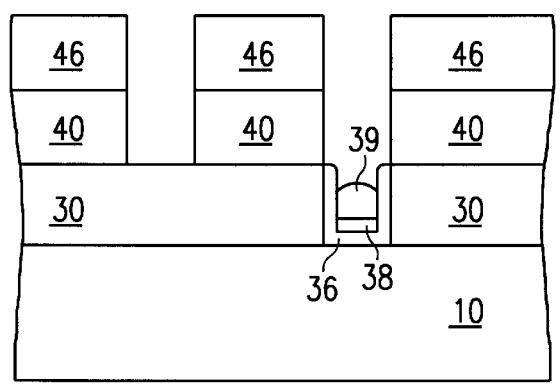
FIGS. 5A–5G show a combination via and conductor process which provides conductors with insulating the sidewall encapsulation and conducting a top and bottom encapsulation.
Figure 5B:
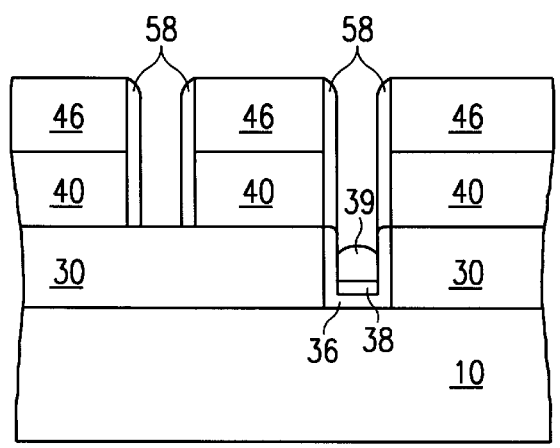
Figure 5C:
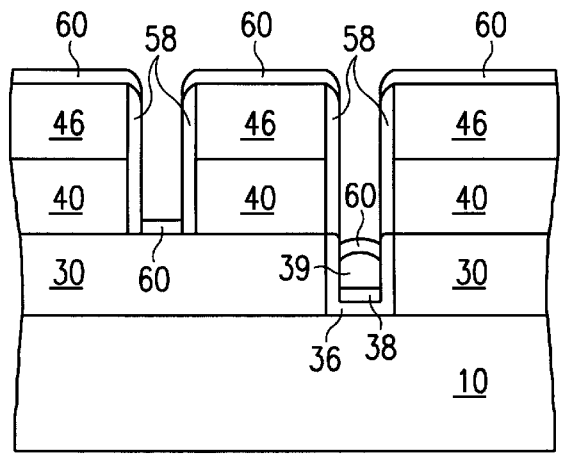
Figure 5D:
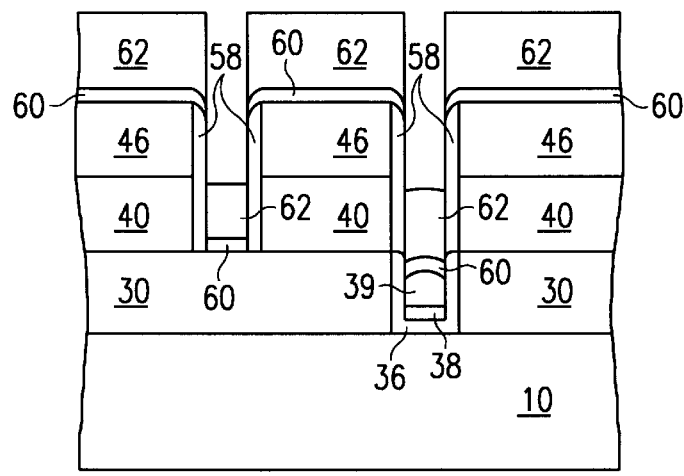
Figure 5E:
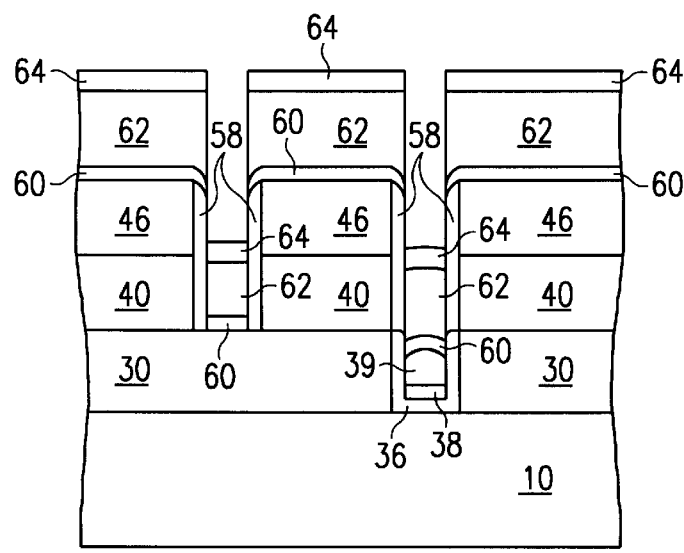
Figure 5F:
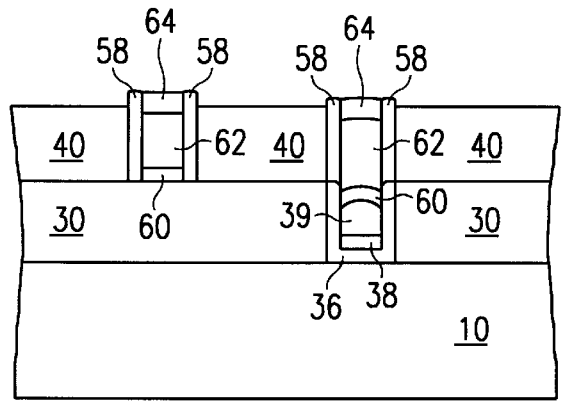
Figure 5G:
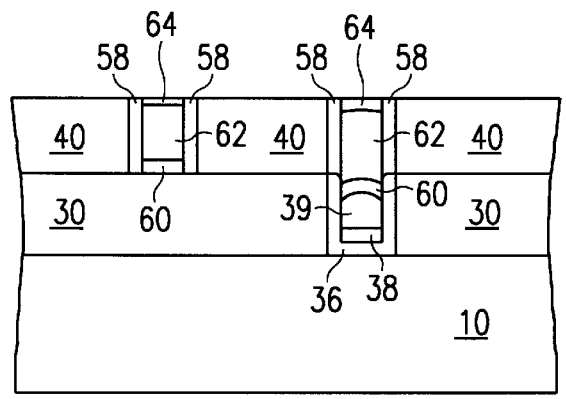

FIGS. 3A–3G show an encapsulation type process for vias and conductors (again as might be used with copper metalization). FIG. 3A shows additional layers deposited on the top of the configuration of FIG. 2E. A low density aerogel layer 40, a high density aerogel 42, a sacrificial layer 44 and a photoresist layer 46 have been deposited in a manner generally as described for layers 12, 14, 16, and 18 as described with regard to FIG. 1A. A conductor groove 47 has been shown open down to the via and a second conductor groove 49 has been opened down to the innerlayer dielectric 30 (but no over a via). Encapsulation layer 48 (e.g., 0.10 micron of silicon nitride) has been deposited (e.g., by chemical vapor composition). Selective deposition initiator 50 has been isotropically deposited (e.g., 0.01 microns of palladium, platinum or copper) to produce the structure of FIG. 3B. FIG. 3C shows the structure after the photoresist 46 has been stripped to lift off the portions of the encapsulating layer 48, and in particular the selective deposition initiator 50 which were above the photoresist 46. FIG. 3D shows conductor metal 52 deposited in conductor grooves 47 and 49. Preferably the conductor 52 is deposited at least in part by electroless deposition. The conductor metal in conductor groove of 47 extends down to and makes electrical contact with the via metal 39 (here through selective deposition initiator 50 and through the conductor metal 52 can also be deposited initially by electroless deposition and then by physical vapor deposition. Preferably the conductor metal 52 deposited initially by electroless deposition and then by physical deposition and preferably the conductor metal 52 fills the conductor grooves 47 and 49 to just below the bottom level of the sacrificial layer 44 to give the configuration shown in FIG. 3D. FIG. 3E shows a top encapsulation 54 deposited by physical vapor deposition (e.g., 0.01 micron of titanium nitride). FIG. 3F shows the structure after stripping of the sacrificial layer 44 to liftoff any conductor metal which inadvertently deposited during selective deposition of conductor metal 52, as well as conductor metal deposited on top of the sacrificial layer 44 by physical vapor deposition, if used, and also excess top encapsulation material again which deposited on top of sacrificial layer 44. Note also that if selective deposition or were used to completely deposit the conductor metal 52 that the sacrificial layer prevents mushrooming from any conductors that were over fill FIG. 3G shows the structure after chemical mechanical polishing has been used to planarize the surface. Polarizations is preferred as the very fine geometry's have a very small depth of field for lithography. Note also that the utilization of a relatively thick top encapsulation 44 provides tolerances for variation in depth of filling of conductor metal, such that all conductors preferably have at least a thin layer of top encapsulation 54 and that planarization has exposed the top of encapsulation 54 for all conductors. FIGS. 4A–4E show a process for a via conductor combination using vias filled to less than the height of an intralevel dielectric. FIG. 4A shows a substrate 10 with an intralevel dielectric 30 and photoresist 34 after the photoresist has been lithographically exposed, developed and the intralevel dielectric 30 has been etched to provide a via opening. FIG. 4B shows the structure after via metal 39 has been selectively deposited. The selective deposition fills the via to less than the height of the inner level dielectric 30. While the selective deposition can be stopped prior to the via metal reaching the top of the intralevel dielectric 30, the selective deposition could also be continued to over the top of the intralevel dielectric 30 and then an etch back process used to reduce the metal level back to below the top of the dielectric 30. FIG. 4C shows the structure after stripping of the photoresist. Again, stripping the photoresist removes any via metal which inadvertently was deposited on top of the photoresist. FIG. 4D shows the structure after a deposition of the conductor metalization 56. This deposition can be, for example, by vacuum deposited or sputtering, for example, aluminum FIG. 4E shows the structure after planarization. Preferably the planarization is by chemical electromechanical polishing, but can be performed by spinning on a planarizing material such as photoresist then etching back the photoresist to remove the top portion of the conductor metal 56 and provide planarization. FIGS. 5A–5G show a combination via and conductor process which provides conductors with insulating the sidewall encapsulation and conducting a top and bottom encapsulation. FIG. 5A shows a substrate 10 with a dielectric 30 and a via liner 36 (e.g., of titanium nitride) a via selective deposition initiator 38 and via metal 39 (generally the configuration of FIG. 2E). A low density nanaporous dielectric 40 and a photoresist layer 46 have been deposited (again over the configuration of FIG. 2E and the photoresist lithographically exposed and developed and the nanaporous dielectric 40 etched to provide two openings, one down to the intralevel dielectric 30 and the second down to expose the via metal 39. In FIG. 5B, an insulating conductor encapsulating material has been isotropically deposited and then an anisotropically etched to provide a sidewall configuration, each of silicon nitride 58. FIG. 5C shows the structure after an isotropic deposition of conductive conductor bottom encapsulation 60 (e.g., titanium nitride). FIG. 5D shows conductor metal 62 (e.g., copper vacuum deposited or sputtered). FIG. 5E shows the structure after the deposition of a conductor top encapsulation 64 (e.g., 0.05–0.2 microns of an isotropically titanium nitride). Notice that the top encapsulation is preferably relatively thick to allow for planarization. FIG. 5F shows the structure after stripping the photoresist, to lift off top portions of the conductive conductor bottom and encapsulation 60. The conductor metal 62 and the conductive conductor encapsulation 64. FIG. 5G shows the structure after planarization. Again, the planarization may be by chemical mechanical polishing.

Figure 6A:
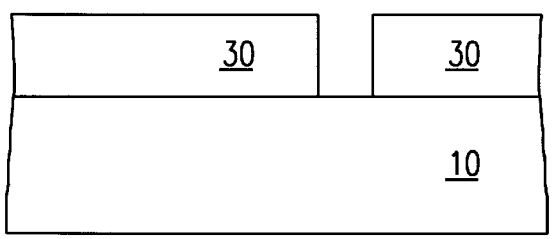
FIGS. 6A–6F shows an embodiment wherein the vias are opened and the conductor grooves are patterned and then selective metal (e.g., aluminum) is used to partially fill the via and then the conductor metal is deposited.
Figure 6B:
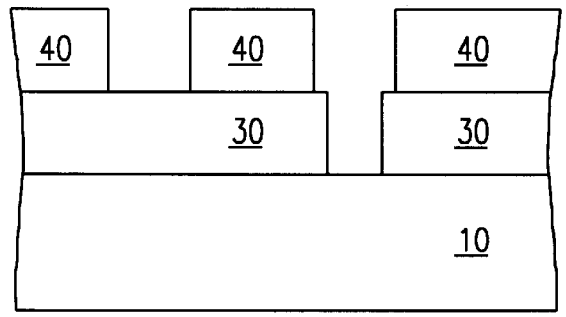
Figure 6C:
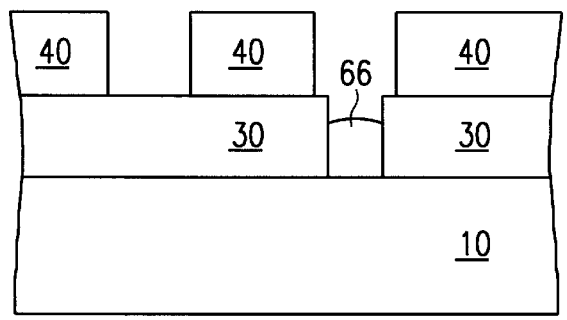
Figure 6D:
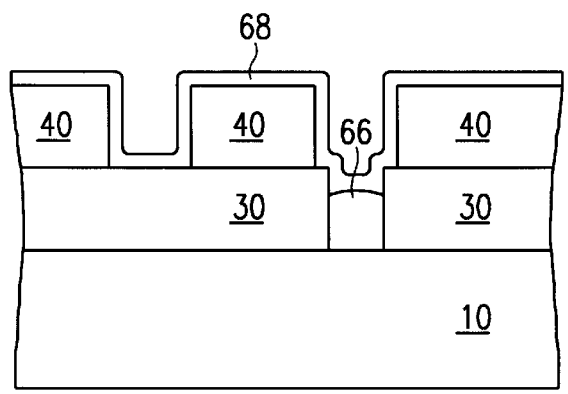
Figure 6E:
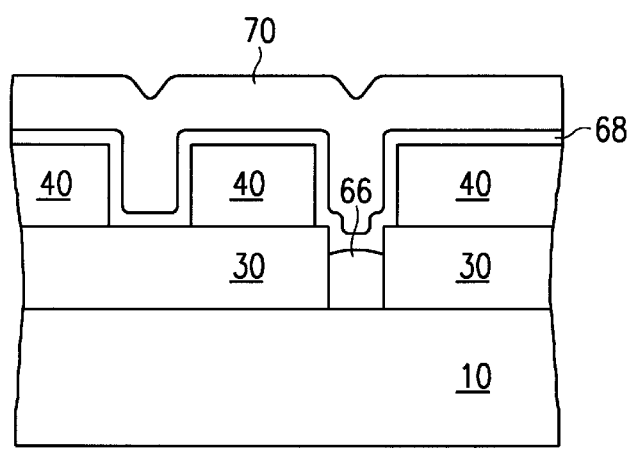
Figure 6F:
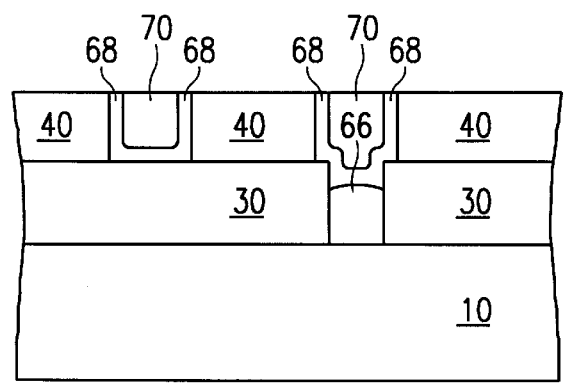

FIG. 6A shows a substrate 10 with a via opening through interlayer dielectric 30 (e.g., silicon dioxide applied as a spinon glass). FIG. 2B shows a nanoporous silica dielectric layer 40 patterned with conductor grooves. FIG. 6C shows the structure after deposition of selective metal (e.g., aluminum) here with the selective metal deposition initiated by a conductive area in the substrate at the bottom of the via. In FIG. 6E conductor metal 70 has been deposited over the entire area, including filling the conductor grooves (e.g., PVD or CVD aluminum). FIG. 6F shows the structure after planarization, where the excess conductor metal 70 has been removed and the planarization has also removed the portions of cut formal conductor liner 68 which were on top of the nanoporous dielectric 40. An advantage of this method is that the patterning is completed prior to the deposition of via and conductor metals and thus, for example, the deposition of the via metal the conductor liner, and the conductors can be done sequentially in the same chamber.

The invention is not to be construed as limited to the particular examples described here, as these are to be regarded as illustrative, rather than restrictive. For example, alternate embodiments can use high density layer of silicon dioxide (e.g. spin-on glass) in place of the aerogel 14 applied over the low density aerogel (which then has been aged and dried. A barrier layer (e.g., 0.05 microns of silicon nitride) is preferably applied over the aerogel 14 prior to the application of the high density layer of silicon dioxide. The invention is intended to cover all process and structures which do not depart from the spirit and the scope of the invention.

We claim:

1. A method of forming a conductor on a planar interlevel dielectric layer which is over an electronic microcircuit substrate, said method comprising:

A. forming at least one intralevel dielectric layer over said interlevel dielectric layer;

B. forming one or more sacrificial layers over said intralevel dielectric layer;

C. depositing a photoresist layer onto said sacrificial layer and patterning said photoresist for use as an etch mask for forming a conductor groove;

D. forming said conductor groove in said sacrificial layer and said intralevel dielectric layer exposing a portion of said interlevel dielectric layer;

E. anisotropically depositing a selective deposition initiator onto said photoresist layer and onto said exposed portion of said interlevel dielectric layer;

F. stripping said photoresist after anisotropically depositing said selective deposition initiator;

G. selectively depositing conductor metal to fill said groove in the intralevel dielectric layer to between at least half-full and up to and around the level of the sacrificial layer; and H. stripping said sacrificial layer after said selective deposition of said conductor metal.

2. The method of claim 1, deposited conductor metal consists of aluminum, copper and in which the selectively depositing conductor metal includes selectively depositing one of aluminum, copper and combinations thereof.

3. The method of claim 1, wherein said selectively deposited conductor metal is principally copper.

4. The method of claim 1, wherein selectively depositing conductor metal to fill said groove in the intralevel dielectric layer to between at least half-full and up to and around the level of the sacrificial layer includes depositing additional conductor metal by physical vapor deposition.

5. The method of claim 4, wherein said additional conductor metal is deposited by HDP sputtering.

6. The method of claim 5, wherein said sputtering is at a temperature of 300–600 degrees C.

7. The method of claim 6, wherein said sputtering is followed by metal reflow at a temperature of 300–600 degrees C. or extrusion at a pressure of 500–4000 psi.

8. The method of claim 5, wherein a dopant metal is deposited along with said additional conductor metal.

9. The method of claim 1, wherein said selective deposition initiator is selected from the group consisting of tungsten, titanium, paladium, platinum, copper, aluminum, and combinations thereof.

10. The method of claim 1, wherein said intralevel dielectric is nanoporous silica.

11. The method of claim 9, wherein said selective deposition initiator is paladium, and said selectively deposited conductor metal is principally copper.

12. The method of claim 1, wherein said selectively depositing conductor metal essentially fills said groove to form said conductors, and thereafter, planarizing said conductors and the intralevel dielectric by chemical mechanical polishing.

13. A method of forming a conductor on a planar interlevel dielectric layer which is over an electronic microcircuit substrate, said method comprising:

A. forming at least one intralevel dielectric layers over said interlevel dielectric layer;

B. forming a layer of photoresist on said intralevel dielectric layer which is patterned and utilized as an etch mask;

C. forming a conductor groove in said intralevel dielectric layer exposing a portion of said interlevel dielectric layer;

D. anisotropically depositing a selective deposition initiator onto the exposed portion of said interlevel dielectric layer;

E. selectively depositing conductor metal to fill said groove in the intralevel dielectric layer to between at least half-full and up to and around the level of the photoresist.

F. stripping said photoresist after said selective deposition of said conductor metal.

14. The method of claim 13, wherein selectively depositing conductor metal to fill said groove in the intralevel dielectric layer to between at least half-full and up to and around the level of the photoresist, additional conductor metal is deposited by physical vapor deposition.

15. The method of claim 14, wherein a dopant metal is deposited along with said additional conductor metal.

16. The method of claim 13, wherein said selectively depositing conductor metal essentially fills said groove to form said conductors, and thereafter, said conductors and said intralevel dielectric are planarized by chemical mechanical polishing.

* * * * *